(12) United States Patent
Fu et al.

(10) Patent No.: US 9,397,477 B2
(45) Date of Patent: Jul. 19, 2016

(54) EXTERNAL-CAVITY TUNABLE LASER WITH FLEXIBLE WAVELENGTH GRID TUNING FUNCTION

(71) Applicant: Accelink Technologies Co., Ltd., Wuhan (CN)

(72) Inventors: Yanfeng Fu, Wuhan (CN); Di Zhang, Wuhan (CN); Qianggao Hu, Wuhan (CN); Xuesheng Tang, Wuhan (CN); Shenglei Hu, Wuhan (CN); Yi Tang, Wuhan (CN); Kun Qian, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 0 days.

(21) Appl. No.: 14/432,051

(22) PCT Filed: Oct. 29, 2012

(86) PCT No.: PCT/CN2012/083657
§ 371 (c)(1),
(2) Date: Mar. 27, 2015

(87) PCT Pub. No.: WO2014/048003
PCT Pub. Date: Apr. 3, 2014

(65) Prior Publication Data
US 2015/0288142 A1     Oct. 8, 2015

(30) Foreign Application Priority Data

Sep. 28, 2012   (CN) .......................... 2012 1 0367748

(51) Int. Cl.
*H01S 3/10*     (2006.01)
*H01S 5/14*     (2006.01)
(Continued)

(52) U.S. Cl.
CPC . *H01S 5/141* (2013.01); *G02B 5/28* (2013.01); *G02F 1/1337* (2013.01); *G02F 1/13439* (2013.01); *G02F 1/133553* (2013.01); *H01S 3/1065* (2013.01); *H01S 5/02284* (2013.01); *H01S 5/14* (2013.01); *H01S 5/4062* (2013.01); *H01S 5/0687* (2013.01)

(58) Field of Classification Search
CPC ......... H01S 5/0687; H01S 5/141; H01S 5/14; H01S 5/02284; H01S 5/4062
USPC .......................... 372/20, 32, 99, 98, 101, 108
See application file for complete search history.

(56) References Cited

U.S. PATENT DOCUMENTS 5,493,426 A * 2/1996 Johnson .............. G02F 1/13471
                                                                349/130
5,592,314 A * 1/1997 Ogasawara ......... G02F 1/13473
                                                                349/114
(Continued)

FOREIGN PATENT DOCUMENTS

CN           1930748 A       3/2007
CN           1316696 C       5/2007
(Continued)

OTHER PUBLICATIONS

International Search Report for Application No. PCT/CN2012/083657 dated May 2, 2013.

*Primary Examiner* — Kinam Park
(74) *Attorney, Agent, or Firm* — Lerner, David, Littenberg, Krumholz & Mentlik, LLP (57) ABSTRACT

An external-cavity tunable laser with a flexible wavelength grid tuning function comprises a resonant cavity, collimating lenses, an optical isolator, and an output optical fiber. The resonant cavity comprises a semiconductor gain chip, a beam expander collimating lens, a combined liquid crystal tunable filter assembly, and a reflecting mirror. A current injected to the semiconductor gain chip is converted to broadband spontaneously radiating photons through electrical-to-optical conversion, and the photons are spread along a waveguide toward two sides. A part of photons with special frequencies go back and forth multiple times in the resonant cavity to form a laser after a threshold condition is met. The laser is collimated by the collimating lens, passes through the optical isolator, is coupled by the collimating lens, and enters the output optical fiber.

12 Claims, 5 Drawing Sheets

(51) Int. Cl.
*H01S 5/40* (2006.01)
*G02B 5/28* (2006.01)
*H01S 3/106* (2006.01)
*H01S 5/022* (2006.01)
*G02F 1/1335* (2006.01)
*G02F 1/1337* (2006.01)
*G02F 1/1343* (2006.01)
*H01S 5/0687* (2006.01)

(56) References Cited

U.S. PATENT DOCUMENTS

| | | | |
|---|---|---|---|
| 6,847,661 B2 | 1/2005 | Jerman et al. | |
| 7,508,849 B2 | 3/2009 | Tanaka et al. | |
| 7,991,024 B2 | 8/2011 | Sato et al. | |
| 2002/0172239 A1* | 11/2002 | McDonald | G02B 5/281 372/20 |
| 2005/0213618 A1* | 9/2005 | Sochava | H01S 5/06255 372/20 |
| 2009/0009668 A1* | 1/2009 | Tan | G02B 5/3016 349/1 |
| 2009/0141747 A1 | 6/2009 | Sato et al. | |

FOREIGN PATENT DOCUMENTS

| | | |
|---|---|---|
| JP | 10300974 | 11/1998 |
| WO | 02082599 A1 | 10/2002 |
| WO | 2005101595 A1 | 10/2005 |

\* cited by examiner

EXTERNAL-CAVITY TUNABLE LASER WITH FLEXIBLE WAVELENGTH GRID TUNING FUNCTION

TECHNICAL FIELD

Embodiment of invention involves a tunable laser, in particular, a kind of external-cavity tunable laser with flexible wavelength grid tuning function.

TECHNICAL BACKGROUND

Tunable lasers have wide applications in optical communication field, especially in recent years when the optical network is developing towards a dynamic optical network. The future optical platform will need to support a variety of different data rates and types of customer data service. Based on a fixed frequency interval (e.g., 50 GHz, 100 GHz), existing DWDM system can not make efficient use of spectrum resources of optical fibers, thereby limits the effective expansion of optical fiber transmission capacity.

To solve this problem, a concept of flexible wavelength grid was proposed in this industry, i.e., the wavelength interval uses a variable wavelength grid which is determined by frequency bins with a certain range of frequencies. The center frequency of the wavelength grid is defined as the center of frequency bin whose width is an integral multiple of a standard frequency bin size, and the frequency bins can be combined in an arbitrary way. Therefore, ITU-T (ITU Telecommunication Standardization Sector) expanded the grid standard, and defined the grid size as 12.5 GHz, frequency interval as an integer multiple of 12.5 GHz, and the center frequency of the frequency bin as $193.1 \pm n \times 0.00625$ THz (n is an integer). Flexible wavelength grid can allocate a suitable width of frequency bin, according to rate and modulation pattern requirements of the transmission signal, to realize a transmission system with high spectral efficiency and large capacity, such as the Orthogonal Frequency Division Multiplexing System (OFDM). As a result, the role of tunable laser with flexible wavelength grid tuning function and narrow linewidth is becoming increasingly prominent.

Currently, the main two methods for realizing flexible wavelength grid are as follows: one method realized the continuous wavelength adjustment within a certain range to cover any grid; and the other realized the adjustment with grid size as small as possible.

The US patent (U.S. Pat. No. 6,847,661 B2) published a continuously tunable external-cavity laser based on Micro-Electron-Mechanical System (MEMS). In order to realize a larger continuous adjustment range, drivers arrayed in a fan shape make the external-cavity MEMS reflector rotate around an imaginary axis at a distal end. Thus, structure of the MEMS driver is very complex, poor in reliability, especially in shock resistance.

US patent (U.S. Pat. No. 7,991,024 B2) published a kind of liquid crystal external cavity tunable laser, using a liquid crystal filter as the channel selection element and a Fabry-Perot (F-P) etalon to generate a fixed frequency grid. The Fabry-Perot etalon is to limit the output wavelength at the standard ITU-T wavelength and suppress longitudinal modes adjacent to the lasing wavelength. In this way, its Free Spectral Range (FSR) can be set at a standard ITU-T interval, such as 50 GHz or 100 GHz. The liquid crystal filter is actually a liquid crystal Fabry-Perot interferometer, which has only one transmission peak within the operating band to select that of one etalon in this band. However, since single LC filter has a wide bandwidth, normally about 1 nm, when the grid interval of Fabry-Perot etalon is fixed to be small (e.g. 12.5 GHz), application of the scheme is rather limited.

SUMMARY OF INVENTION

Whereas to overcome the shortcomings of the above mentioned technical solutions, embodiment of invention provides an external-cavity tunable laser with flexible wavelength grid tuning function.

The External-Cavity Tunable Laser with flexible wavelength grid tuning function, comprises Resonant Cavity (13), Collimating Lens (6, 7), Optical Isolator (8) and Output Fiber (9). The Resonant Cavity (13) includes Semiconductor Optical Amplifier (1), Expanded Beam Collimator Lens (2), Combined Liquid Crystal Tunable Optical Filter Component (3) and Reflector (5). Current into the Semiconductor Gain Chip (1) is electro-optically converted to spontaneously radiating broadband photons emitting to both sides along waveguide. A portion of the photons at specific frequency forms laser, after multiple round trips in the Resonant Cavity (13) to meet threshold condition and realize oscillating amplification. The output laser, after passing the Collimating Lens (6) for collimation and passing the Optical Isolator (8), is coupled into the Output Fiber (9) through the Collimating Lens (7). The Combined Liquid Crystal Tunable Optical Filter Component (3) is formed by two stages of tunable liquid crystal filters connected in cascade.

Preferably, the Combined Liquid Crystal Tunable Optical Filter Component (3) is formed by two independent tunable LC Fabry-Perot filters connected in cascade. The tunable LC Fabry-Perot filter of each stage contains Anti-reflection Film (31), Glass Substrate (32), Indium Tin Oxide Transparent Electrode (33), High-Reflective Film (34), Alignment Layer (35), LC Molecular Layer (36), Glass Plate (37) and Sealant (38). The Alignment Layer (35) is set on both sides of the LC Molecular Layer (36). The Alignment Layer (35) and the LC Molecular Layer (36) adhere to a piece of Glass Plate (37), with both ends sealed with the Sealant (38) to form LC layer, on both sides of which there are the High-Reflective Film (34), the Indium Tin Oxide Transparent Electrode (33), the Glass Substrate (32) and the Anti-reflection Film (31) in sequence.

Preferably, the Combined Liquid Crystal Tunable Optical Filter Component (3) contains primary LCTOF and secondary LCTOF, which include primary LC Molecular Layer (36') and secondary LC Molecular Layer (36") respectively. Both primary and secondary LC Molecular Layers (36', 36") have Alignment Layers (35) on both sides, adhering with the primary and secondary LC Molecular Layers (36', 36") to a piece of Glass Plate (37) and have both ends sealed with Sealant (38) to form LC layers. The primary and secondary LC layers have High-Reflective Film (34), Indium Tin Oxide Transparent Electrode (33) and Glass Substrate (32) on both sides in sequence. The primary and secondary LCTOF share the Glass Substrate (32) in the middle, which is coated with Anti-reflection Film (31) on outside.

Preferably, the primary and secondary tunable filters are independently controlled by their own Control Voltage (V1, V2), respectively.

Preferably, the Resonant Cavity (13) also includes Fixed Grid Generator (4) which is set between the LCTOF Component (3) and Reflector (5).

Preferably, the external-cavity tunable laser further contains Wavelength Locker (12) which comprises Fixed Grid Generator (4), Beam Splitter Prism (10-1, 10-2) and Photodetector (11-1, 11-2), and the Beam Splitter Prism (10-1) is set between the Collimating Lens (6) and Optical Isolator (8).

Preferably, the Reflector (5) is a movable device, and the resonant cavity length of the external-cavity tunable laser can be changed by varying the position of the Reflector (5) on the optical axis.

In embodiment of the invention, the external-cavity tunable laser, through the combined liquid crystal tunable filter component and the thermal optic tunable fixed grid generator, forms a tunable optic filter structure with flexible and continuous tunable grid, which enables the external-cavity laser to have features of operating at any wavelength in the C and L bands, and flexible wavelength grid, multi-channel, precise positioning and fast channel switching.

FIGURE DESCRIPTION

FIGS. 7(a) and (b) are respectively the spectrum superposition schematic and superimposed transmission spectrum of the combined liquid crystal tunable filter obtained by numerical simulation;

SPECIFIC EMBODIMENTS

The implementation practice of embodiment of invention shall be explained in detail via specific embodiment and drawings below for a better understanding of this invention.

As mentioned above, in order to overcome the shortcomings of current lasers with flexible wavelength grid, in embodiment of invention, the combined liquid crystal tunable filter component and the thermal optic tunable fixed grid generator form a quasi-continuous tunable filter structure with flexible grid. An embodiment of invention uses the tunable filter as channel filter of the external-cavity tunable laser. The combined liquid crystal tunable filter is of narrow bandwidth and fast tuning, and thus enables the external-cavity tunable laser to have features of operating at any wavelength in the C and L-band, and flexible wavelength grid, multi-channel, precise positioning and fast channel switching.

Figure 1:
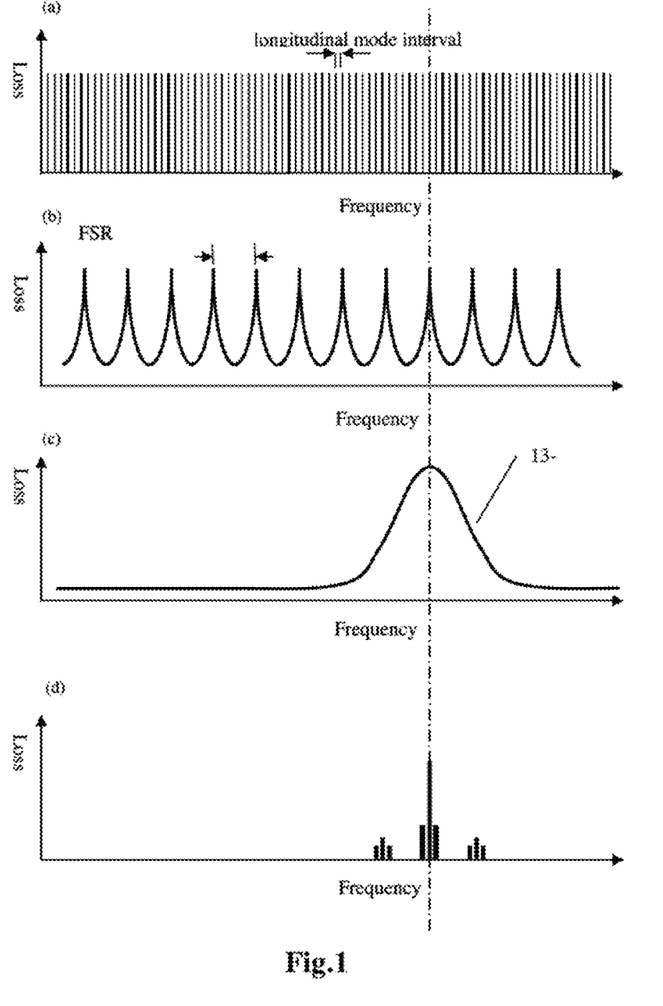
FIG. 1 is the wavelength selection schematic of tunable laser with single-stage LC filter.

As shown in FIG. 1, it is the tuning schematic of a single-stage LC tunable laser based on fixed grid. For realizing ITU-T wavelength output, fixed grid generator is generally F-P etalon, whose transmission peak is ITU-T standard wavelength. Channel switching filter is a LC type F-P interferometer used to select different ITU-T channels. In order to make the channel selection filter have only one transmission peak within the working band, the filter has a wide FSR (free spectral range). For example, to make the laser working at C-band, FSR of the filter needs to be not less than the wavelength range covered by the C-band. In this case, due to the limitation by the preciseness of LC F-P interferometer, this filter has a larger FWHM (full width at half maximum), usually about 1 nm. Thus this single-stage liquid crystal tunable laser generally works only at the 50 GHz and 100 GHz ITU-T interval. When the fixed grid generator have a smaller ITU-T interval, the single-stage liquid crystal tunable filter will choose multiple channels and cannot produce a stable laser output.

Figure 2:
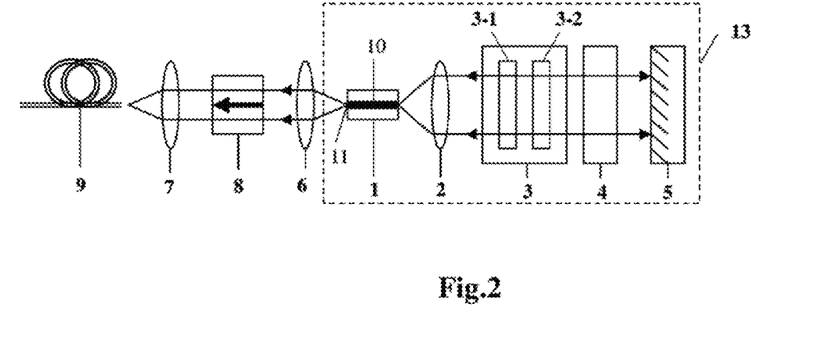
FIG. 2 shows External-Cavity Tunable Laser with fast and flexible wavelength grid tuning function of the first preferred embodiment of this invention.

A preferred embodiment of the external-cavity tunable laser with flexible wavelength grid tuning function is shown in FIG. 2, and mainly comprises Semiconductor Gain Chip 1, Expanded Beam Collimator Lens 2, Combined Liquid Crystal Tunable Optical Filter Component 3, fixed grid generator 4, Reflector 5, Outputting Beam Collimating Lens 6 and 7, Optical Isolator 8 and Output Fiber 9, wherein the Gain Chip 1 is used to provide gain, with both end faces are coated with partly reflecting film and Anti-reflection Film respectively. The Semiconductor Gain Chip 1, Expanded Beam Collimator Lens 2, Combined Liquid Crystal Tunable Optical Filter Component 3, Fixed Grid Generator 4 and Reflector 5 form the Resonant Cavity 13 of the external-cavity laser (as shown by dotted lines).

Current into the Semiconductor Gain Chip 1 is electro-optically converted to spontaneously radiating broadband photons emitting to both sides along the waveguide. A portion of the photons at specific frequency form laser emitting from end face 11 of optical waveguide 10, after multiple round trips in the Resonant Cavity 13 formed by Semiconductor Gain Chip 1, Expanded Beam Collimator Lens 2, Combined Liquid Crystal Tunable Optical Filter Component 3, Fixed Grid Generator 4 and Reflector 5 to meet the threshold condition and realize oscillating amplification. The output laser, after passing the Collimating Lens 6 for collimation and passing Optical Isolator 8, is coupled into the Output Fiber 9 through the Collimating Lens 7. Reflector 5 is a movable device. Changing the position of Reflector 5 can vary the resonant cavity length of the laser, and realize the desired phase matching conditions to generate laser with certain frequency.

Figure 3:
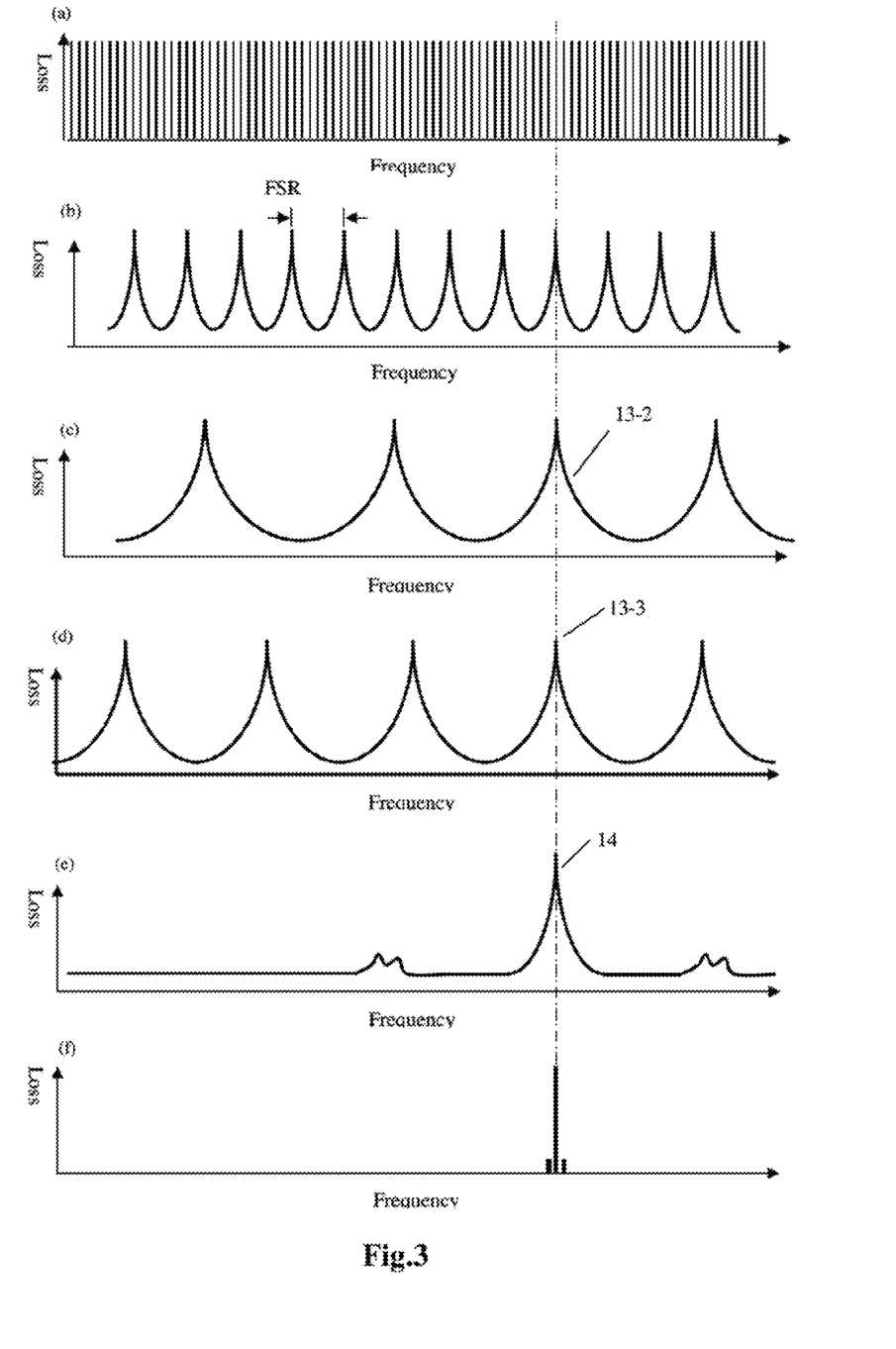
FIG. 3 shows the spectrum superposition of the combined liquid crystal tunable filter in FIG. 2.

Different from the U.S. Pat. No. 7,991,024 B2 using a single liquid crystal tunable filter as a channel switching filter, embodiment of invention uses Combined Liquid Crystal Tunable Optical Filter Component 3 as a switching channel filter, which is made up of two stages of independent tunable liquid crystal F-P filters 3-1, 3-2 connected in cascade, with spectrum superposition drawing as shown in FIG. 3. In order to meet the requirements of a wide adjustable range and narrow-band optical filtering at same time, each of liquid crystal F-P filters 3-1 and 3-2 uses appropriately reduced FSR. For example, even for full C-band tuning application, it uses FSR smaller than the C-band full bandwidth. Therefore, under the same process conditions, narrower passband 3 dB bandwidth is attainable. Secondly, the two separate liquid crystal F-P tunable filters 3-1 and 3-2 are designed with different FSR, to obtain resonance filter passband according to the vernier effect of periodic structure.

Compared with a single liquid crystal tunable filter, Combined Liquid Crystal Tunable Optical Filter Component 3 has obvious advantages. On one hand, the two filters connected in series will further reduce the 3 dB bandwidth of passband, and tolerate a smaller grid interval such as 12.5 GHz and 25 GHz when using Combined Liquid Crystal Tunable Optical Filter Component 3 as the channel switching filter of the tunable lasers. More importantly, while the FSRs of both independent tunable LC FP filters 3-1 and 3-2 are both less than the full C-band bandwidth, the total FSR of Combined Liquid Crystal Tunable Optical Filter Component 3 is greater than the full C-band bandwidth. Also, due to the vernier effect, wide range tuning over the full C-band can be realized as long as the FSRs of each independent tunable LC FP filter 3-1 and 3-2 are reached, and the driving voltage is thus significantly lowered.

As described above, the Combined Liquid Crystal Tunable Optical Filter Component 3 is made of two single-stage liquid crystal filters 3-1 and 3-2 connected in cascade, both of which are Fabry-Perot multi-beam interference filters, with evenly arranged nematic liquid crystal as cavity medium.

Figure 4:
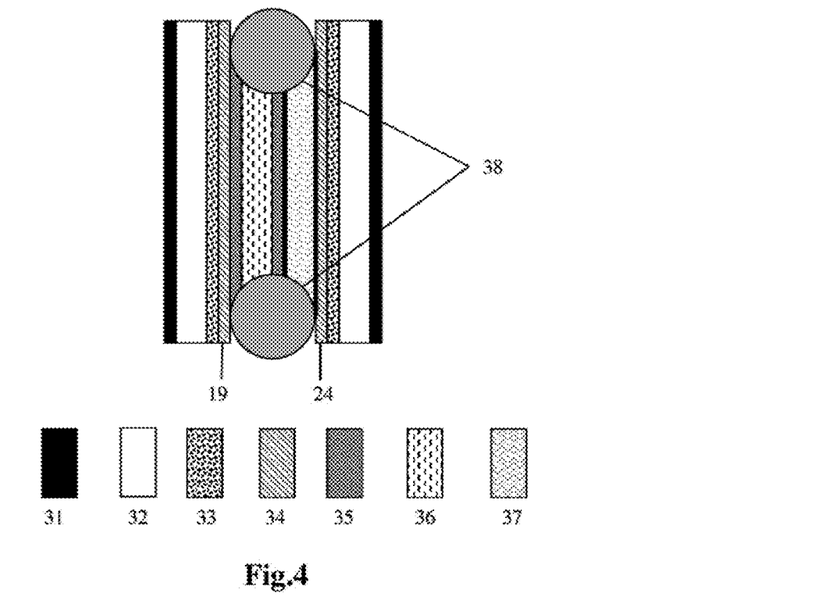
FIG. 4 is the structural schematic of a single-stage liquid crystal filter element in the combined liquid crystal tunable filter of FIG. 2.

Basic structure of single-stage liquid crystal filters 3-1, 3-2 is shown in FIG. 4, comprising Anti-reflection Film 31, Glass Substrate 32, Indium Tin Oxide (ITO) Transparent Electrode 33, High-Reflective Film 34, Alignment Layer 35, LC Molecular Layer 36, Glass Plate 37 and Sealant 38. The Alignment Layer 35 is set on both sides of the LC Molecular Layer 36. The Alignment Layer 35 and the LC Molecular Layer 36 adhere to a piece of Glass Plate 37, with both ends sealed with the Sealant 38 to form LC layer, on both sides of which there are the High-Reflective Film 34, the Indium Tin Oxide Transparent Electrode 33, the Glass Substrate 32 and the Anti-reflection Film 31 in sequence. Glass Plate 37 uses glass with refractivity close to that of liquid crystal and with relatively smaller expansion coefficient and thermo-optical coefficient, in order to reduce the thickness of the liquid crystal layer and improve performance of the liquid crystal filters 3-1, 3-2 (reducing response time).

Transparent Electrode 33 is placed outside of the High-Reflective Film 34, beyond the actual F-P cavity to reduce the loss of 1.55 μm light intensity resulted from Transparent Electrode 33. The light pass surfaces of both Glass Substrate 32 and Glass Plate (37) in the cavity are coated with Anti-reflection Film 31. Two High-Reflective Films 34 with reflectivity up to 95% form two high-reflective surfaces of F-P cavity. Light beam travels back and forth between the two dielectric film reflective layers 19, 24 and transmission light cause a multi-beam interference. Light waves of some frequencies are added or subtracted by each other under interference, generating a comb-shape transmission peak distribution.

Figure 5:
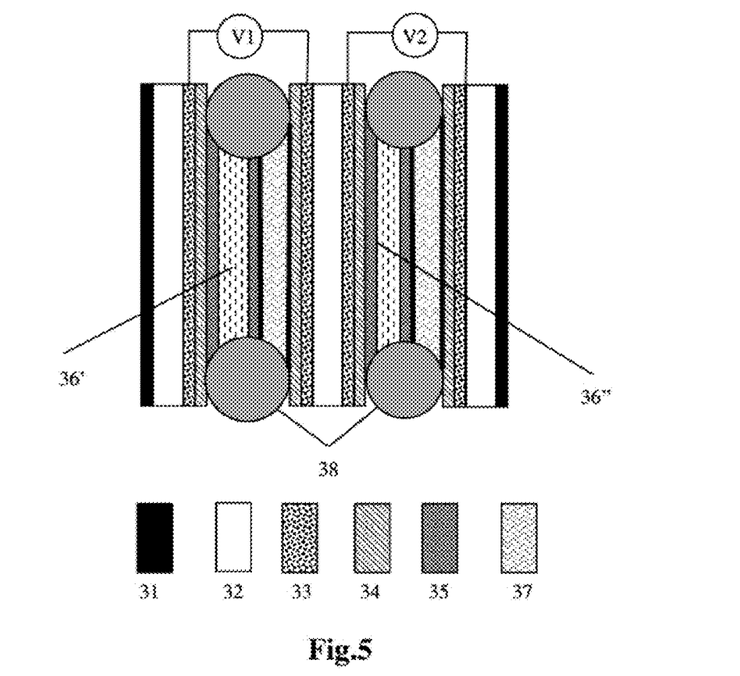
FIG. 5 is the structural schematic of a preferred embodiment of the combined liquid crystal tunable filter in FIG. 2.

The Combined Liquid Crystal Tunable Optical Filter Component 3 can be made of two independent single-stage liquid crystal filters 3-1, 3-2 connected in cascade as shown in FIG. 4, or with structure as in FIG. 5, which shows another preferred embodiment of structure of the Combined Liquid Crystal Tunable Optical Filter Component 3, comprising Anti-reflection Film 31, Glass Substrate 32, Indium Tin Oxide (ITO) Transparent Electrode 33, High-Reflective Film 34, Alignment Layer 35, LC Molecular Layer 36' and 36", Glass Plate 37 and Sealant 38. The primary and secondary LC tunable filters have the same structure as the single-stage liquid crystal filters in FIG. 4, independently controlled by their own Control Voltages V1 and V2. The primary and secondary LC tunable filters contain primary and secondary LC Molecular Layers 36' and 36" respectively which, together with Alignment Layer 35 on their both sides respectively, adhere to a piece of Glass Plate 37 and have both ends sealed with Sealant 38 to constitute LC layers. The primary and secondary LC layers have High-Reflective Film 34, Indium Tin Oxide Transparent Electrode 33 and Glass Substrate 32 on both sides in sequence. The primary and secondary LCTOF share the Glass Substrate 32 in the middle and the outside Glass Substrate 32 is coated with Anti-reflection Film (31) on the external surface. Structure of the Combined Liquid Crystal Tunable Optical Filter Component 3 in FIG. 5 suffers less light loss on the middle interface in using and has a more compact structure as a whole as compared with the structure using two independent liquid crystal tunable filters.

The continuously tunable wavelength range $\Delta\lambda_c$ of a single LC filter's comb-shape transmission peak is determined by the following formula:

$$\Delta\lambda_c = \frac{2 \cdot |n_e - n_o| \cdot d_{LC}}{m} \quad (1)$$

Wherein $d_{LC}$ is the thickness of LC molecular layer 36, and m is the coherent order, $$m = \text{round}\left(\frac{\lambda_c}{FSR}\right) \quad (2)$$

Wherein round ( ) means rounding function, $\lambda_c$ is the peak wavelength of the filter and FSR is free spectrum range determined by the formula as below:

$$FSR = \frac{\lambda_c^2}{2 \cdot (n_o \cdot d_{LC} + n_p \cdot d_p + n_{eq} \cdot d_{eq})} \quad (3)$$

Wherein $n_p$ is the refractivity of Glass Plate 37, $d_p$ is the thickness of Glass Plate 37, $n_{eq}$ and $d_{eq}$ are the equivalent optical length of other medium in the cavity. Result of formula (3) indicates the function of Glass Plate 37, i.e., when LC thickness $d_{LC}$ is hard to be increased, expected FSR is obtainable through adjusting $d_p$.

Figure 6:
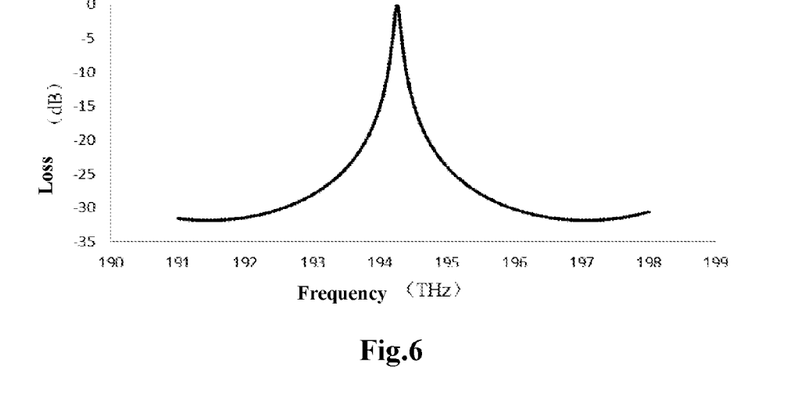
FIG. 6 is the transmission spectrum of the single-stage liquid crystal tunable filter obtained by numerical simulation.
Figure 7:
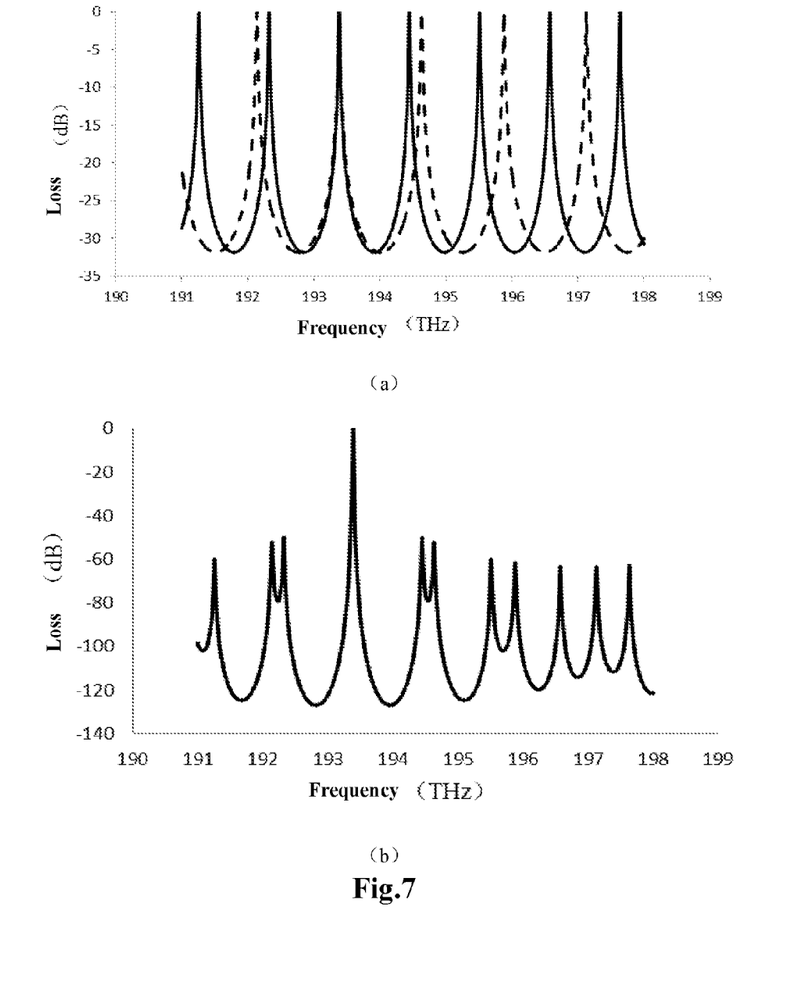

We can see the difference between single-stage LC filter and double-stage LC filter through numerical analysis. As shown in FIG. 6, when single-stage LC tunable filter is adopted, FSR of the filter need to be larger than 40 nm to ensure only one transmission peak over the full C-band. When the dielectric film reflectivity of both end faces of the filter is 95%, side-mode suppression ratio of the transmission spectrum is 31.2 dB, FWHM is 59.1 GHz. When two single-stage LC tunable filters are combined, the FSR of the primary filter can be set as $FSR_1=10$ nm, and that of the secondary filter as $FSR_2=9$ nm. According to the vernier effect, when the transmission peak of one filter overlaps that of the other filter, the next overlapping peak is 90 nm therefrom, thus Combined Liquid Crystal Tunable Filter achieves a large tuning range. In addition, FSR of the two single-stage LC tunable filters are relatively smaller, even with equal reflectivity at the end face, the FWHM will be smaller. As shown in FIG. 7, if reflectivity of High-Reflective Film 34 is 95%, side-mode suppression ratio after overlapping can reach 49.7 dB, while FWHM is only 8.1 GHz.

Figure 8:
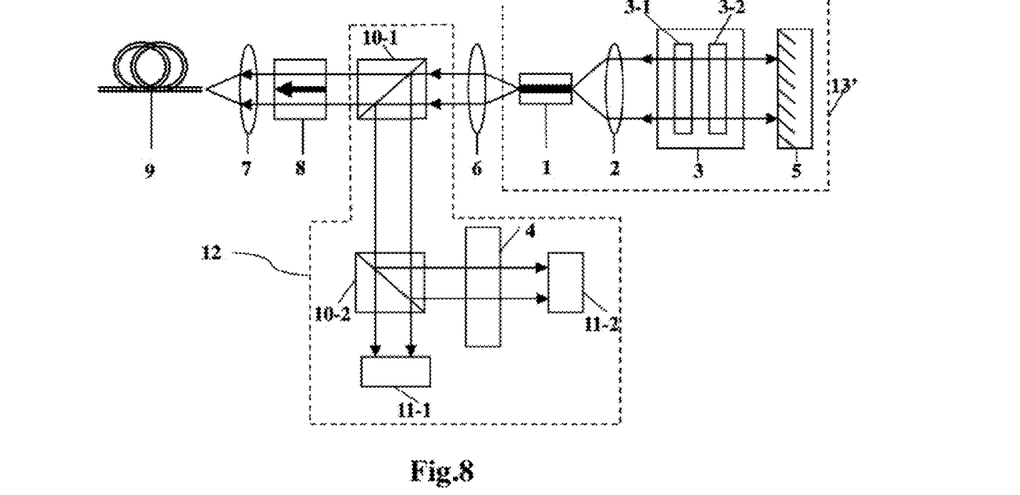
FIG. 8 is a schematic diagram External-Cavity Tunable Laser with fast and flexible wavelength grid tuning function of another preferred embodiment of the invention.

FIG. 8 is another preferred embodiment of the invention, External-Cavity Tunable Laser with fast and flexible wavelength grid tuning function, comprising Semiconductor Gain Chip 1, Beam Collimator Lens 2, Combined Liquid Crystal Tunable Optical Filter Component 3, movable Reflector 5, output beam Collimating Lens 6 and 7, Optical Isolator 8, Output Fiber 9 and Wavelength Locker 12, where Semiconductor Gain Chip 1, Beam Collimator Lens 2, Combined Liquid Crystal Tunable Optical Filter Component 3 and movable Reflector 5 form Resonant Cavity 13' as indicated with dotted line in right of the figure. Wavelength Locker 12 is comprised of Fixed Grid Generator 4, Beam Splitter Prisms 10-1 and 10-2, and Photodetectors 11-1 and 11-2. Collimated light after Collimator Lens 2 is split by Beam Splitter Prism 10-1 and most portion (about 98%) of light is outputted as laser, while a small portion is used for wavelength monitoring. Beam Splitter Prism 10-2 further split a small portion of light split by Beam Splitter Prism 10-1 into two parts, one of which is directly received by Photodetector 11-1 and the other is received by Photodetector 11-2 after going through Fixed Grid Generator 4. Difference between the output wavelength and target wavelength can be decided by comparing the optical powers detected by Photodetectors 11-1 and 11-2 and make appropriate compensation to make the output wavelength approximate the target wavelength. The embodiment in FIG. 8 has an advantage: without the slowly-adjusting device Fixed Grid Generator 4 in Resonant Cavity 13', Wavelength Locker 12 outside the cavity monitors the wavelength instead. Therefore wide range and fast tuning at any wavelength is possible through electro-optical tuning by the Combined Liquid Crystal Tunable Filter 3 without changing the working temperature.

Figure 9:
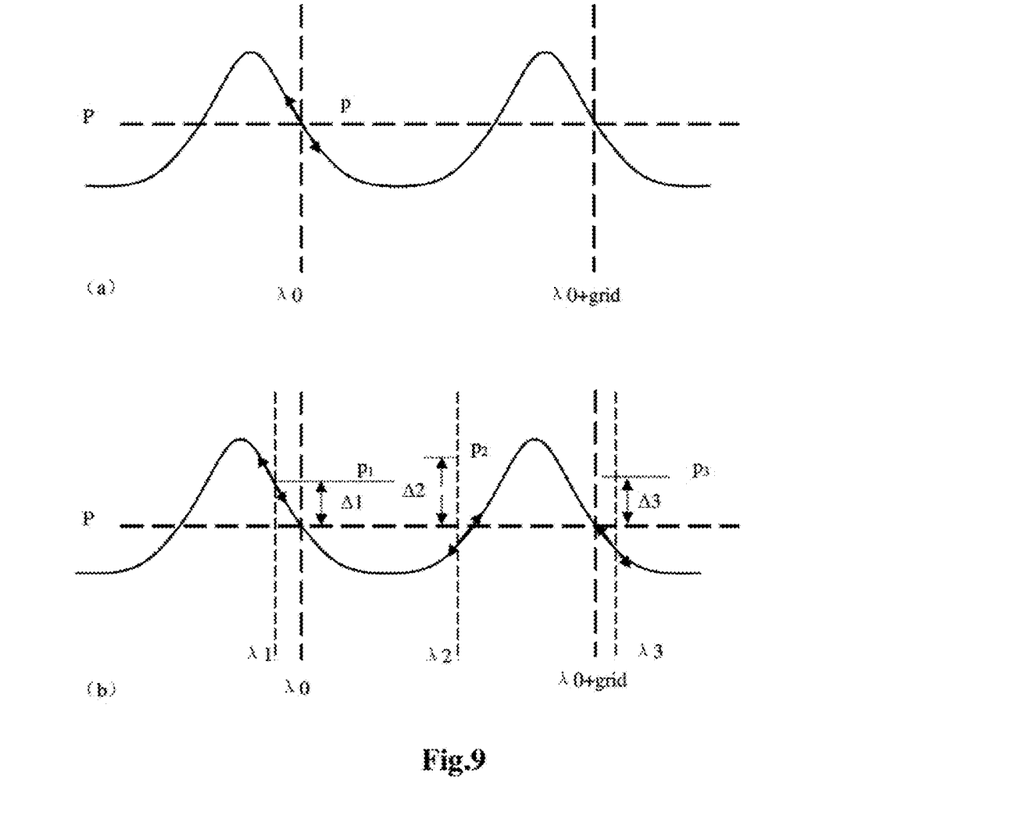
FIG. 9 shows operating principle of realizing the wavelength locker with continuous wavelength monitoring in FIG. 8.

Working schematic Details of using Wavelength Locker 12 for continuous wavelength monitoring is explained as shown in FIG. 9. According to current principle of Wavelength Locker, at a particular center wavelength, detection power of Photodetector 11-1 is set as P; spectrum of the Fixed Grid Generator 4 is set such that the particular center wavelength jest falls in the linear spectrum zone, like the ITU-T wavelength grid shown in FIG. 9($a$). Control logic thereof is to make the detection power p of Photodetector 11-2 at this time equal to power P, then any drift will result in the detection power p deviating from P, providing the wavelength shift information and achieving wavelength monitoring and feedback control. For continuous wavelength monitoring, the spectral structure of Fixed Grid Generator 4 should be properly optimized, and the output ratio scaling of the two Photodetectors 11-1, 11-2 should be corrected according to different wavelengths, then any wavelength can be monitored and locked, details see FIG. 9($b$). Any wavelength $\lambda_i$ different from the ITU-T standard wavelength can be scaled with a power offset $\Delta_i$, such as $\Delta_1$, $\Delta_2$ and $\Delta_3$ (Note: $\Delta_i$ is a signed quantity, which is positive when $p_i$ is greater than P and negative when $p_i$ is smaller than P) corresponding to the three wavelengths $\lambda_1$, $\lambda_2$ and $\lambda_3$ in the figure. With these wavelengths, detection powers of Photodetector 11-2 are $p_1$, $p_2$ and $p_3$ respectively. According to the control logic $p_1-\Delta_1=p_2-\Delta_2=p_3-\Delta_3=p_i-\Delta_i=P$, monitoring and control of any wavelength can be realized. Therefore, such a structure of external-cavity tunable lasers has a wide range continuous and rapid tuning function, not limited by the slowly-adjusting Fixed Grid Generator 4, and capable of precise wavelength locking.

Embodiment of invention, External-Cavity Tunable Laser realizes narrow bandwidth tunable filtering through Combined Liquid Crystal Tunable Filter which also works as channel selection filter for the External-Cavity Tunable Laser. In order to enable the laser to have a flexible grid and wavelength selection function, FSR of the Fixed Grid Generator (typically F-P etalon) adopts a minimum ITU-T interval, so the laser can selectively operate at any ITU-T grid point, namely achieving flexible grid of the laser. F-P etalon (Fixed Grid Generator) can be adjusted by thermo-optic effect, so that the center wavelength of the passband can cover any wavelength point in the C and L-band. Using the Combined Tunable Filter in the external cavity makes fast and flexible grid and continuous tuning possible for the semiconductor external cavity tunable laser In conclusion, embodiment of invention of External-Cavity Tunable Laser with flexible wavelength grid tuning function has the following characteristics:

Firstly, compared with a single liquid crystal tunable filter, the combined liquid crystal tunable filter has such advantages as narrower bandwidth, wider adjustment range and lower driving voltage;

Secondly, the external cavity tunable laser has such characteristics as operating at any wavelength in the C and L-band, flexible wavelength grid, multi-channel, precise positioning and fast channel switching;

Further, the external cavity tunable laser has no moving parts in the resonant cavity, thus is highly stable and reliable;

Finally, the external cavity tunable laser is mature in production process and low in production cost.

Mentioned above are only a few embodiment examples of the invention. Though specific and detailed in description, they should not thereby be understood as limitations to the application scope of this invention. What should be noted is that, possible variations and modifications developed by ordinary technicians in this field, without departing from the inventive concept of this invention, are all covered in the protection scope of this invention. Thus the protection scope of this invention should be subject to the appended Claims.

The invention claimed is:

1. An External-Cavity Tunable Laser with flexible wavelength grid tuning function, comprising Resonant Cavity, Collimating Lens, Optical Isolator and Output Fiber,
   wherein the Resonant Cavity includes Semiconductor Gain Chip, Expanded Beam Collimator Lens, Combined Liquid Crystal Tunable Optical Filter Component and Reflector,
   wherein current into the Semiconductor Gain Chip is electro-optically converted to spontaneously radiating broadband photons emitting to both sides along waveguide,
   wherein a portion of the photons at specific frequency forms laser, after multiple round trips in the Resonant Cavity to meet threshold condition and realize oscillating amplification,
   wherein the output laser, after passing the Collimating Lens for collimation and passing the Optical Isolator, is coupled into the Output Fiber through the Collimating Lens,
   wherein The Combined Liquid Crystal Tunable Optical Filter Component is formed by two stages of tunable liquid crystal filters connected in cascade,
   wherein the Resonant Cavity also includes a Fixed Grid Generator which is set between the Liquid Crystal Tunable Optical Filter Component and Reflector.

2. The External-Cavity Tunable Laser with flexible wavelength grid tuning function in claim 1, wherein the Combined Liquid Crystal Tunable Optical Filter Component is formed by two independent tunable Liquid Crystal Fabry-Perot filters connected in cascade,
   wherein the tunable Liquid Crystal Fabry-Perot filter of each stage contains Anti-reflection Film, Glass Substrate, Indium Tin Oxide Transparent Electrode, High-Reflective Film, Alignment Layer (35), Liquid Crystal Molecular Layer, Glass Plate and Sealant,
   wherein the Alignment Layer is set on both sides of the Liquid Crystal Molecular Layer,
   wherein the Alignment Layer and the LC Molecular Layer adhere to a piece of Glass Plate, with both ends sealed with the Sealant to form Liquid Crystal layer, on both sides of which there are the High-Reflective Film, the Indium Tin Oxide Transparent Electrode, the Glass Substrate and the Anti-reflection Film in sequence.

3. The external-cavity tunable laser with flexible wavelength grid tuning function in claim 1, wherein the Combined Liquid Crystal Tunable Optical Filter Component contains primary Liquid Crystal Tunable Optical Filter and secondary Liquid Crystal Tunable Optical Filter, which include primary Liquid Crystal Molecular Layer and secondary Liquid Crystal Molecular Layer respectively,     wherein both of the primary and secondary Liquid Crystal Molecular Layers have Alignment Layers on both sides, adhering with the primary and secondary Liquid Crystal Molecular Layers to a piece of Glass Plate and having both ends sealed with Sealant to form Liquid Crystal layers,     wherein the primary and secondary Liquid Crystal layers have High-Reflective Film, Indium Tin Oxide Transparent Electrode and Glass Substrate on both sides in sequence,     wherein the primary and secondary Liquid Crystal Tunable Optical Filter share the Glass Substrate in the middle, which is coated with Anti-reflection Film on outside.

4. The external-cavity tunable laser with flexible wavelength grid tuning function in claim 3, wherein the primary and secondary tunable filter are independently controlled by their own Control Voltage, respectively.

5. The external-cavity tunable laser with flexible wavelength grid tuning function according to claim 1, wherein the external-cavity tunable laser further contains Wavelength Locker which comprises Fixed Grid Generator, Beam Splitter Prism and Photodetector,     wherein the Beam Splitter Prism is set between the Collimating Lens and Optical Isolator.

6. The external-cavity tunable laser with flexible wavelength grid tuning function according to claim 1, wherein the Reflector is a movable device, the resonant cavity length of the External-Cavity Tunable Laser can be changed by varying the position of the Reflector on optical axis.

7. The external-cavity tunable laser with flexible wavelength grid tuning function according to claim 2, wherein the external-cavity tunable laser further contains Wavelength Locker which comprises Fixed Grid Generator, Beam Splitter Prism and Photodetector,     wherein the Beam Splitter Prism is set between the Collimating Lens and Optical Isolator.

8. The external-cavity tunable laser with flexible wavelength grid tuning function according to claim 3, wherein the external-cavity tunable laser further contains Wavelength Locker which comprises Fixed Grid Generator, Beam Splitter Prism and Photodetector,     wherein the Beam Splitter Prism is set between the Collimating Lens and Optical Isolator.

9. The external-cavity tunable laser with flexible wavelength grid tuning function according to claim 4, wherein the external-cavity tunable laser further contains Wavelength Locker which comprises Fixed Grid Generator, Beam Splitter Prism and Photodetector,     wherein the Beam Splitter Prism is set between the Collimating Lens and Optical Isolator.

10. The external-cavity tunable laser with flexible wavelength grid tuning function according to claim 2, wherein the Reflector is a movable device, the resonant cavity length of the External-Cavity Tunable Laser can be changed by varying the position of the Reflector on optical axis.

11. The external-cavity tunable laser with flexible wavelength grid tuning function according to claim 3, wherein the Reflector is a movable device, the resonant cavity length of the External-Cavity Tunable Laser can be changed by varying the position of the Reflector on optical axis.

12. The external-cavity tunable laser with flexible wavelength grid tuning function according to claim 4, wherein the Reflector is a movable device, the resonant cavity length of the External-Cavity Tunable Laser can be changed by varying the position of the Reflector on optical axis.

\* \* \* \* \*